United States Patent
Zhang et al.

(10) Patent No.: US 7,572,706 B2
(45) Date of Patent: Aug. 11, 2009

(54) SOURCE/DRAIN STRESSOR AND METHOD THEREFOR

(75) Inventors: Da Zhang, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 123 days.

(21) Appl. No.: 11/680,181

(22) Filed: Feb. 28, 2007

(65) Prior Publication Data

US 2008/0203449 A1  Aug. 28, 2008

(51) Int. Cl.
*H01L 21/336* (2006.01)
*H01L 21/8236* (2006.01)

(52) U.S. Cl. .................. 438/302; 438/274; 438/300; 438/301; 438/303; 438/305; 257/E21.177; 257/E21.29

(58) Field of Classification Search .......... 257/E21.059, 257/E21.06, E21.106
See application file for complete search history.

(56) References Cited

U.S. PATENT DOCUMENTS

| | | | |
|---|---|---|---|
| 5,427,964 | A | 6/1995 | Kaneshiro et al. |
| 6,621,131 | B2 | 9/2003 | Murthy et al. |
| 6,833,307 | B1 | 12/2004 | Wristers et al. |
| 2005/0067662 | A1 | 3/2005 | Lee et al. |
| 2005/0275021 | A1* | 12/2005 | Matsumoto et al. ......... 257/347 |
| 2007/0034906 | A1* | 2/2007 | Wang et al. ................. 257/224 |
| 2007/0235817 | A1* | 10/2007 | Wang et al. ................. 257/392 |
| 2007/0298557 | A1* | 12/2007 | Nieh et al. ................. 438/197 |
| 2007/0298565 | A1* | 12/2007 | Nieh et al. ................. 438/222 |
| 2008/0102573 | A1* | 5/2008 | Liang et al. ................. 438/231 |

OTHER PUBLICATIONS

Hortsmann et al; "Integration and optimization of embedded-SiGe, compressive and tensile stressed liner films, and stress memorization in advanced SOI CMOS technologies"; Electron Devices Meeting, 2005. IEDM Technical Digest. IEEE International Dec. 5-7, 2005 pp. 233-236.

PCT Search report and Written Opinion for corresponding PCT Application No. PCT/US08/53563 mailed May 30, 2008.

\* cited by examiner

*Primary Examiner*—Charles D. Garber
*Assistant Examiner*—Mohsen Ahmadi
(74) *Attorney, Agent, or Firm*—James L. Clingan, Jr.; Ranjeev K. Singh

(57) ABSTRACT

A method for forming a semiconductor device is provided. The method includes forming a gate structure overlying a substrate. The method further includes forming a sidewall spacer adjacent to the gate structure. The method further includes performing an angled implant in a direction of a source side of the semiconductor device. The method further includes annealing the semiconductor device. The method further includes forming recesses adjacent opposite ends of the sidewall spacer in the substrate to expose a first type of semiconductor material. The method further includes epitaxially growing a second type of semiconductor material in the recesses, wherein the second type of semiconductor material has a lattice constant different from a lattice constant of the first type of semiconductor material to create stress in a channel region of the semiconductor device.

15 Claims, 4 Drawing Sheets

SOURCE/DRAIN STRESSOR AND METHOD THEREFOR

BACKGROUND

1. Field

This disclosure relates generally to semiconductor devices, and more specifically, to semiconductor devices having source/drain stressors.

2. Related Art

Source/drain stressors have been developed to provide strain in channel regions to improve transistor performance. Tensile stress applied to the channel has been found to improve electron mobility for N channel transistors while compressive stress applied to the channel has been found to improve hole mobility. The degree of improvement is generally greater with greater stress being applied. The source/drain stressor approach involves removing the semiconductor material near the channel area to form recess regions there and then filling recess regions by growing a semiconductor material of a different type. With silicon being the starting semiconductor material, which is typical, the tensile stress can be exerted by growing silicon carbon and the compressive can be exerted by growing silicon germanium. One limitation on the stress is the carbon and germanium concentrations. Increasing these concentrations increases the stress but also increases the likelihood of dislocations. Dislocations reduce the stress. So the carbon and germanium concentrations are as a large as possible that do not result in forming dislocations. Transistor performance, however, would be improved with further increases in strain without creating other problems such as increasing transistor leakage.

Thus, there is a need for further improving the performance of devices with source/drain stressors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An angled implant is performed from the source side of a transistor to form a source implant region that is at least nearly under the edge of the gate. The gate has a thin sidewall spacer at the time of the implant. The gate acts as a mask for the drain side so that the doped region formed on the drain side by the implant is spaced from the gate. A subsequent anneal ensures that the source side doped region is at least aligned to the edge of the gate and may extend under the gate a small amount. An etch removes semiconductor material using the gate and sidewall spacer as a mask to form one recess region aligned on the source with the thin sidewall spacer and another recess region aligned on the drain side with the thin sidewall spacer. Forming the recess region on the drain side removes the doped region formed by the implant on the drain side. The source implant region, however, has a portion that extends under the sidewall spacer so that it is not removed by forming the source side recess region. A semiconductor material of a different type is then grown in the recess regions. This different semiconductor material then contacts the remaining portion of the source implant region and also forms a drain on the drain side. The different semiconductor material is preferably in situ doped to avoid the need for a source/drain implant that would tend to relax the strain. The remaining portion of the source implant region thus ensures that source extends at least to the edge of the gate. This is of minimal consequence on the drain side because a voltage applied to the drain will tend to deplete the region immediately adjacent to the drain anyway. Further, having it on the drain side would increase the overall parasitic capacitance. This is better understood by the following description and the drawings.

Figure 1:
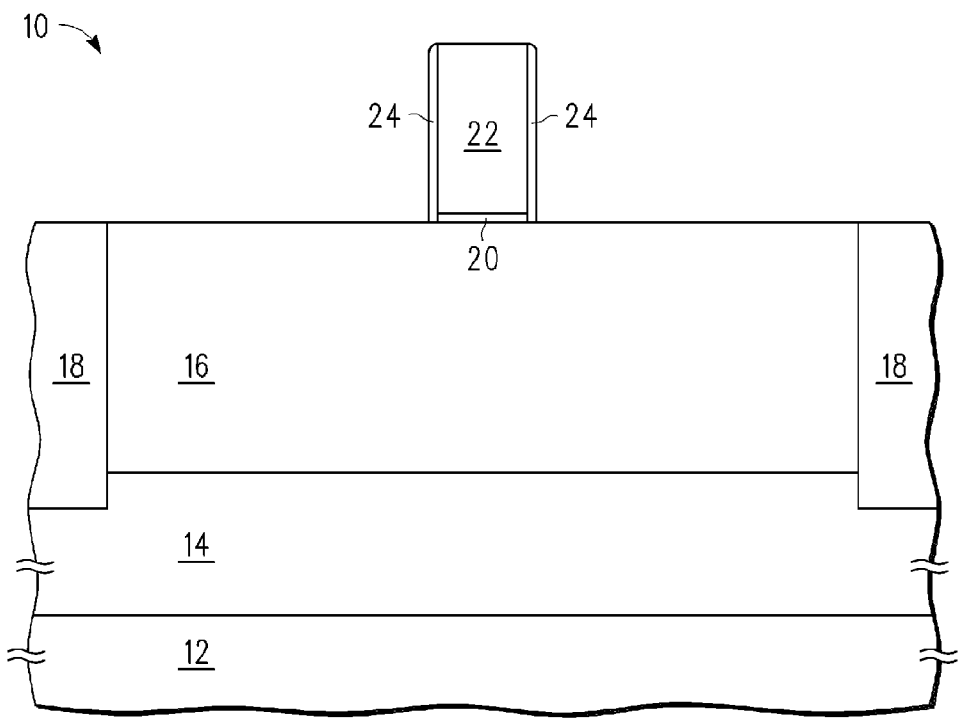
FIG. 1 is a cross section of a semiconductor device at a stage in a process of one embodiment.

Shown in FIG. 1 is a semiconductor device 10 comprising a sustaining substrate 12, an insulating layer 14 over sustaining substrate 12, a semiconductor layer 16 over insulating layer 14, an isolation region 18 establishing a boundary for semiconductor layer 16, a gate dielectric 20 over a portion of semiconductor layer 16, a gate 22 over gate dielectric 20, and a sidewall spacer 24 on the sidewalls of gate 22. The combination of sustaining substrate 12, insulating layer 14, and semiconductor layer 16 is a semiconductor on insulator (SOI) substrate which is a common substrate. A bulk semiconductor type of substrate having no insulating layer may also be used. In such case the top portion of the substrate could be considered a semiconductor layer. Also, semiconductor layer 16 may be multi-layer. For example, semiconductor layer 16 could be a silicon, underlying and relatively thicker, layer with an overlying, thinner SiGe layer. Gate 22 may be multiple layers or a single layer. A single layer of polysilicon is effective for this purpose, but a metal layer or layers or a combination of metal and silicon layers may also be used. Gate dielectric 20 is preferably a grown oxide, which is typical for gate dielectrics, but another material may be used. For example a high K dielectric may be used. Sidewall spacer 24 is preferably formed of nitride but another material may be used. Sidewall spacer 24 is preferably relatively thin. In this described example, sidewall spacer 24 is preferably about 50 Angstroms in thickness, but could vary. An expected range is about 40 to 100 Angstroms but that could vary as well.

Figure 2:
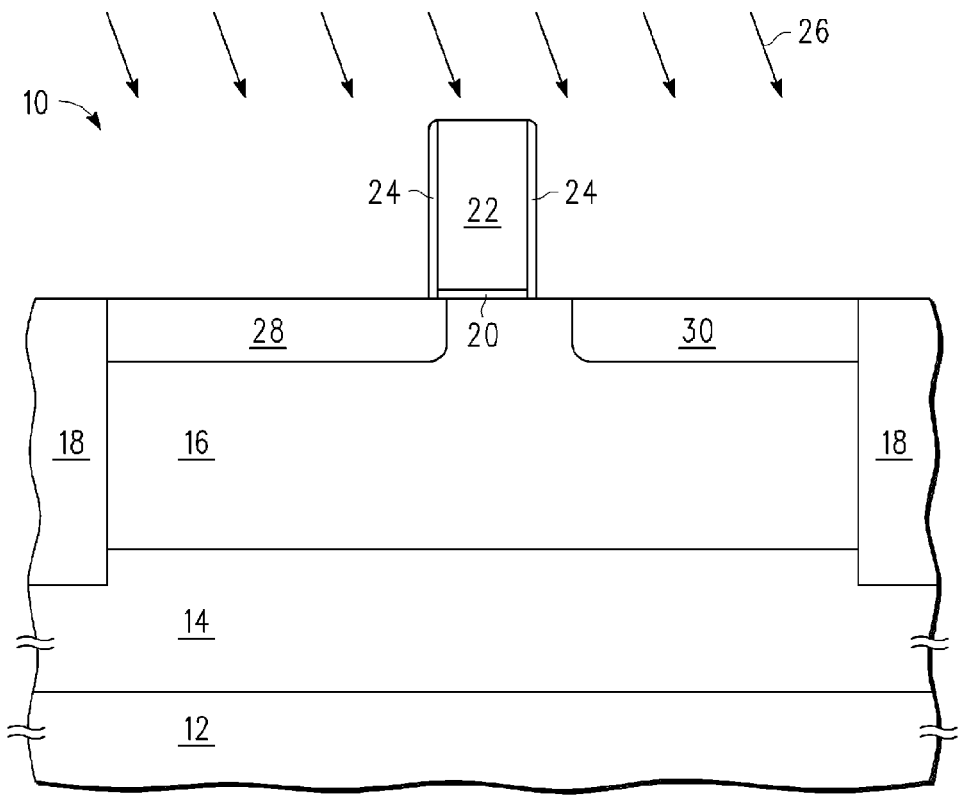
FIG. 2 is a cross section of the semiconductor device of FIG. 1 at a subsequent stage in processing.

Shown in FIG. 2 is semiconductor device after performing an angled implant 26. The angle is preferably about 10 degrees from vertical directed toward a source side so that gate 22 acts as a mask for a drain side. Other angles may also be effective such as 5 to 30 degrees. Angled implant 26 results in forming a doped region 28 and a doped region 30. Doped region 28 is on the source side. Doped region 30 is on the drain side. Doped region 28 has a portion that extends under sidewall spacer 24. Doped region 30, on the other hand, is spaced from gate 22 and sidewall spacer 24. Implant 26 is a species useful in forming sources and drains. Thus, for the case where semiconductor device 10 is to be an N channel transistor, implant 26 may be an implant of arsenic or phosphorus or both. For the P channel case, implant 26 may be an implant of boron or boron di-fluoride ($BF_2$). The depth of doped region 28 is chosen to be the depth that is desired for the depth of the source at the interface with the channel. The degree to which doped region 28 extends under sidewall spacer 24 and potentially gate 22 can be determined by the angle and the energy. In this example, doped region 28 extends to about the edge of the gate, which is the interface between gate 22 and sidewall spacer 24 on the source side. The energy is also used for setting the depth. The angle also has an effect on the depth.

Figure 3:
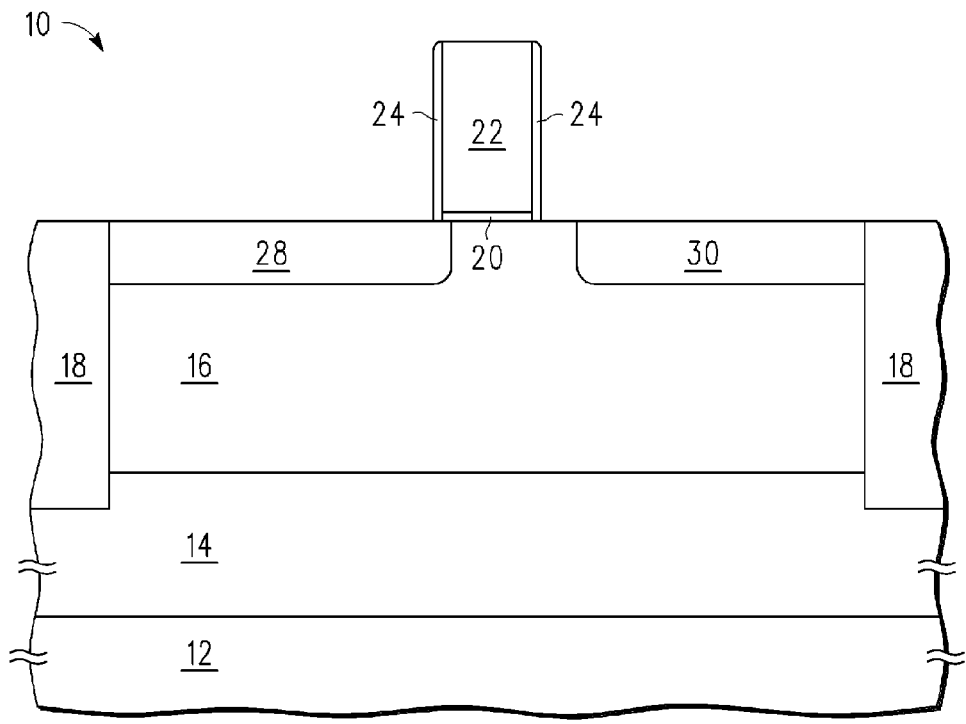
FIG. 3 is a cross section of the semiconductor device of FIG. 2 at a subsequent stage in processing.

Shown in FIG. 3 is semiconductor device 10 after an anneal that has the affect of expanding doped regions 28 and 30 as well as activating dopants in doped region 28. This anneal ensures that doped region 28 at least extends to the edge of gate 22 and will typically extend a little amount under gate 22.

Figure 4:
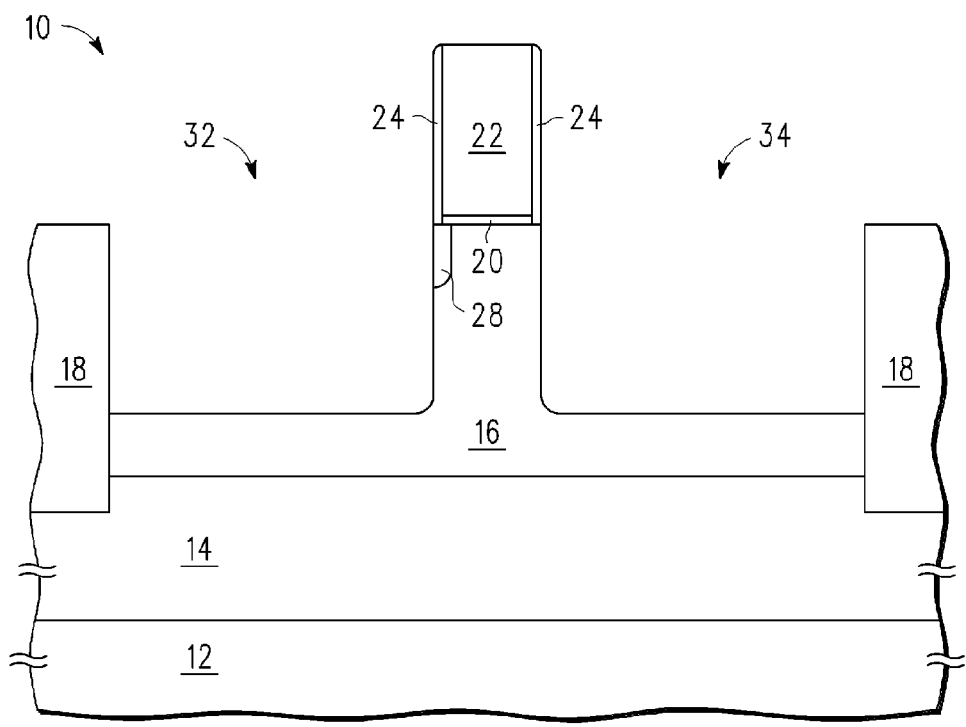
FIG. 4 is a cross section of the semiconductor device of FIG. 3 at a subsequent stage in processing.

Shown in FIG. 4 is semiconductor device 10 after an etch using sidewall spacer 24 and gate 22 as a mask to result in a recess 32 on the source side aligned to sidewall spacer 24 and a recess 34 on the drain side aligned to sidewall spacer 24. Recesses 32 and 34 leave some of semiconductor layer 16 between recesses 32 and 34 and insulating layer 14. Recesses 32 and 34 can be viewed as being on opposite ends of sidewall spacer 24.

Figure 5:
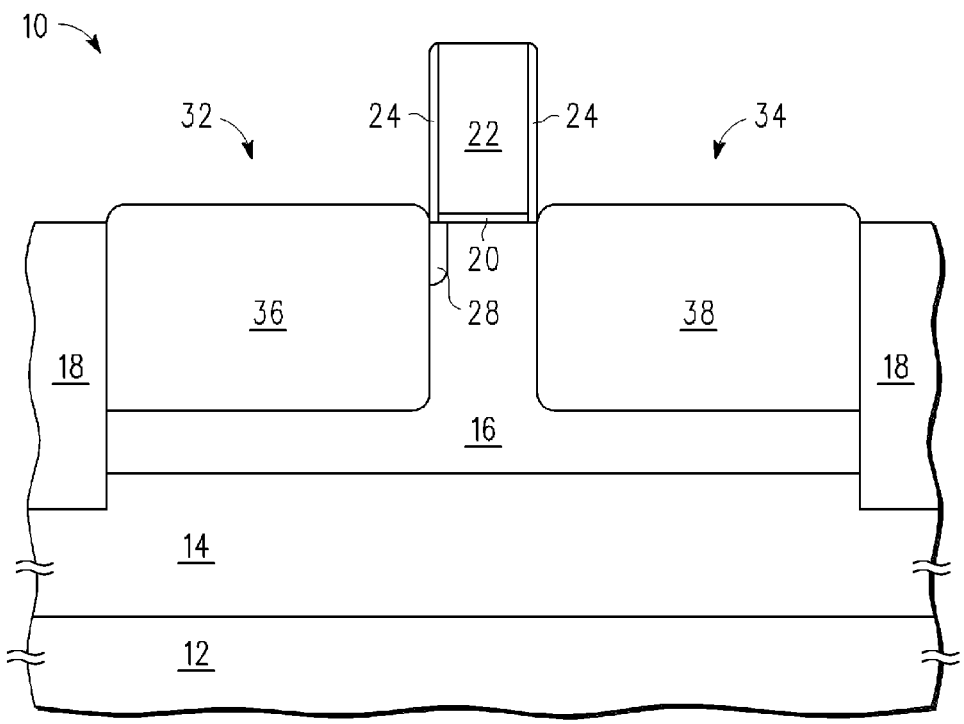
FIG. 5 is a cross section of the semiconductor device of FIG. 4 at a subsequent stage in processing.

Shown in FIG. 5 is semiconductor device 10 after forming semiconductor region 36 in recess 32 and semiconductor region 38 in recess 34 by epitaxial growth. Semiconductor regions 36 and 38 are stressors for a channel region directly under gate dielectric 20 and between the remaining portion of doped region 28 and semiconductor region 38. For the case where semiconductor device 10 is an N channel device, semiconductor regions 36 and 38 exert a tensile stress. The tensile stress may be achieved by growing silicon carbon (SiC) to form semiconductor regions 36 and 38. For the case where semiconductor device 10 is a P channel device, semiconductor regions 36 and 38 exert a compressive stress. The compressive stress may be achieved by growing silicon germanium (SiGe) to form semiconductor regions 36 and 38. Other semiconductor materials may be found to be usable for this purpose. The stress arises from the lattice constant of the seed layer being different from the natural lattice constant of the semiconductor region being grown. The grown semiconductor layer is forced into the lattice structure of the seed layer and thereby is caused to exert stress. Prior to performing the epitaxial growth, a clean of semiconductor layer 16 must normally be performed. It is generally not feasible to avoid forming a layer of native oxide on semiconductor layer 16 after performing the etch that forms recesses 32 and 34. In order to perform the epitaxial growth, it is desirable for the layer functioning as a seed to be free from other materials. This is particularly true, as in the case for forming semiconductor regions 36 and 38, when the grown materials need to be free of dislocations. In order to achieve the surface for the desired epitaxial growth, a clean of the surface is performed. Necessarily this will normally be a chemistry, such as HF, that will remove oxide. The clean can also be a combination of multiple steps. One example is the use of an HF wet clean followed by a hydrogen gaseous prebake that is done in situ within the epitaxial chamber. In the case where gate dielectric 20 is oxide, it is important that the clean not come in contact with gate dielectric 20 because it would then etch gate dielectric 20. The remaining portion of doped region 28 protects gate dielectric 20 from the chemistry used for the clean on the source side. On the drain side, the portion of semiconductor layer 16 under sidewall spacer 24 protects gate dielectric 20 from the chemistry used for the clean. Sidewall spacer 24, on both the source and drain side, protects gate dielectric 20 from the chemistry used for the clean. Semiconductor regions 36 and 38 can be in situ doped in that they may be doped to the desired conductivity type, P or N, during their growth. For P type, the in situ doping will normally be boron and for N type, phosphorus or arsenic or both. For normal transistor formation, semiconductor regions 36 and 38 are formed to be the same conductivity type as doped region 28. In such case, semiconductor region 36 and the remaining portion of doped region 28 form a continuous conductivity type suitable for functioning as a source. An anneal step, which may replace the previously described anneal step, may be performed after semiconductor regions 36 and 38 are grown but there is a risk that will cause relaxation of the stress or excessive dopant diffusion. Thus, it is expected that it would normally be better to perform any anneals before growing semiconductor regions 36 and 38.

Figure 6:
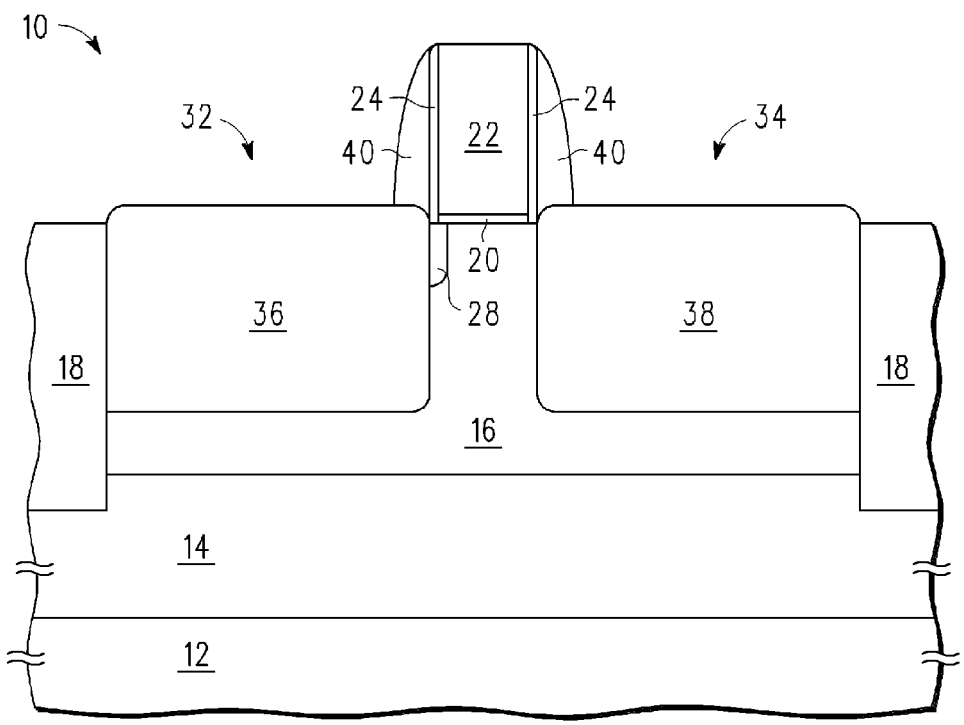
FIG. 6 is a cross section of the semiconductor device of FIG. 1 at a subsequent stage in processing.

Shown in FIG. 6 is semiconductor device 10 after forming sidewall spacer 40 on the sidewall of spacer 24. Sidewall spacer 40 is preferably nitride but could be another material or combination of materials. Sidewall spacer 40 is preferably thicker than sidewall spacer 24. An example of such a lateral thickness is about 400 Angstroms at the thickest point.

Figure 7:
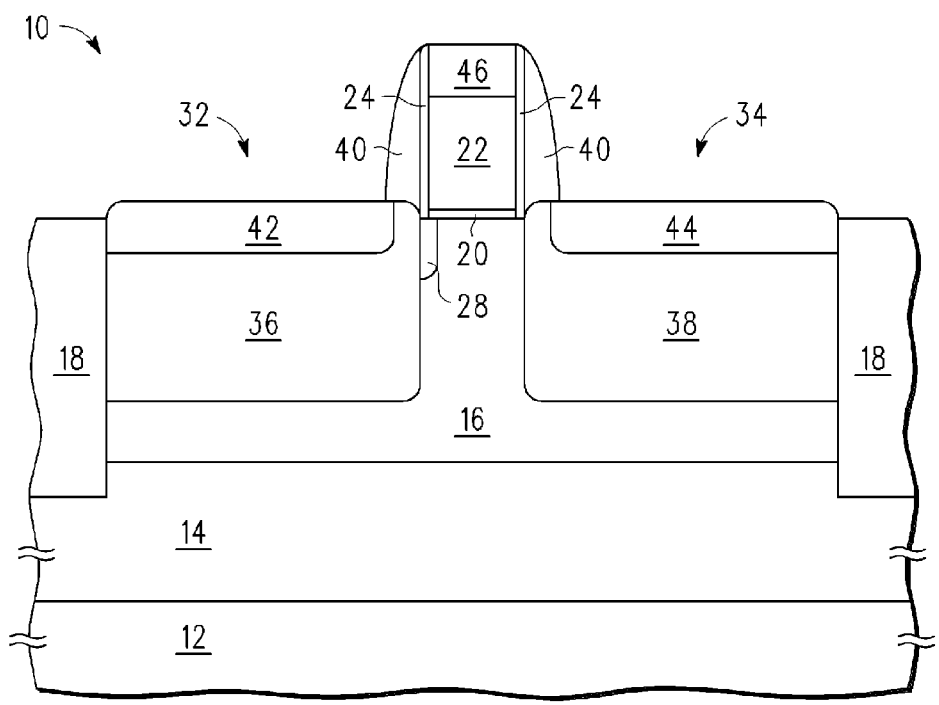
FIG. 7 is a cross section of the semiconductor device of FIG. 6 at a subsequent stage in processing.

Shown in FIG. 7 is semiconductor device 10 after forming silicide regions 42 and 44 on the top surface of semiconductor regions 36 and 38. Sidewall spacers, in conventional fashion, protect the channel and the gate dielectric from the silicide. Deep source/drain formation by such as implantation may be conducted prior to silicide formation. Further processing, such as forming interlayer dielectric layers and contract layers, may continue.

Figure 8:
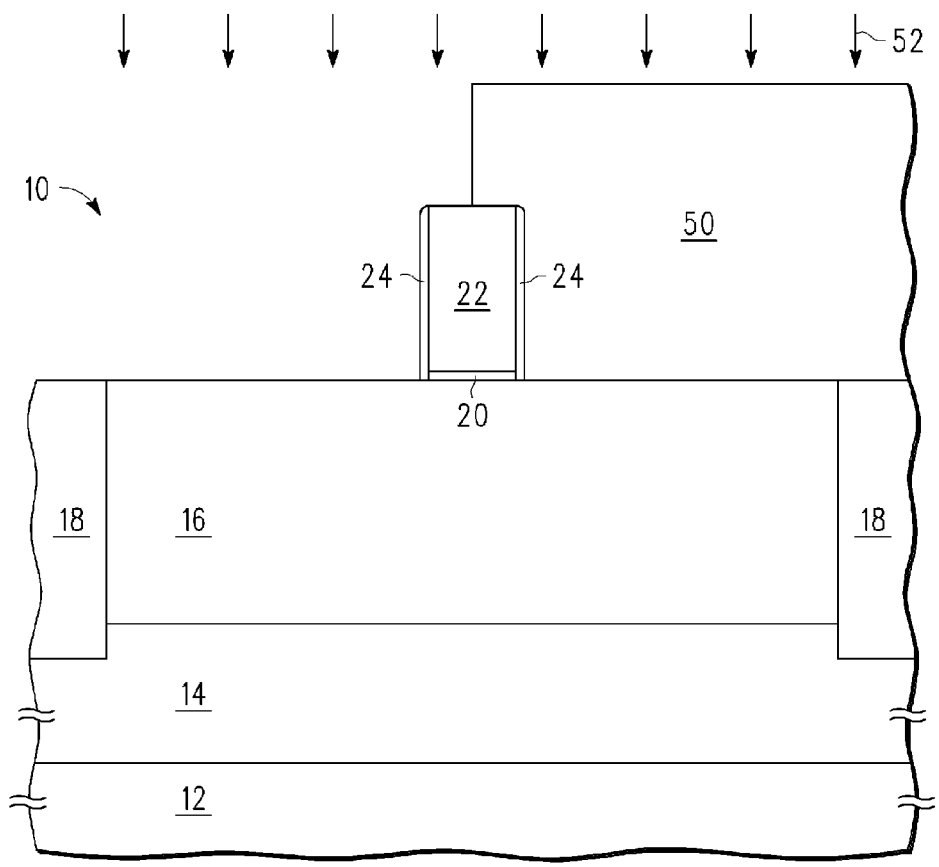
FIG. 8 is a cross section of a semiconductor device similar to that of FIG. 1 at stage in a process according to anther embodiment.

In another embodiment, a drain side protection layer is applied for forming doped regions on only the source side after gate stack formation. Shown in FIG. 8 is semiconductor device 10 of FIG. 1 with a patterned photoresist layer 50 exposing the source side and covering the drain side. An implant and anneal are performed after the photoresist patterning. Due to the masking of the patterned photoresist layer 50, the implant and anneal results in a doped region 28 as shown in FIG. 3 but with no doped region on the drain side. Processing continues as shown in FIGS. 4-7 to achieve a semiconductor device with source/drain stressors. Although there is a space between semiconductor region 38, which functions as the drain, and the edge of gate 22 on the drain side, this does not present much of an additional problem. In operation voltages are applied to the gate and drain which results in carriers overcoming the electrostatic potential barrier at the source. The onset of conduction is little affected by the drain side so long as the drain is not too far from the inversion in the channel caused by the gate. The space under sidewall spacer 24 adds a little resistance but this disadvantage is offset by the reduction in parasitic capacitance by the drain being spaced further away from the gate.

By now it should be appreciated that there a semiconductor device having stressors close to the channel which avoids the gate dielectric from being exposed to a clean in preparation for growing the stressors. One stressor is actually as close to the channel as possible because it is at the drain-channel interface, and the other stressor is only separated from the channel by a small distance, about the thickness of sidewall spacer 24. This close proximity to the channel increases the stress as compared to stressors that are further from the channel.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, other materials may be used. The semiconductor layer could itself be multiple layers. One such example would be a silicon layer with a SiGe layer immediately over the silicon layer. In such case the etch which forms the recesses would remove both SiGe and silicon. SiGe may be regrown replacing the combination of silicon and SiGe. Also indium or $BF_2$ may be used for P type doping and antimony may be used for N type doping. Also the dimensions given are exemplary and other dimensions may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a semiconductor device, comprising:
    forming a gate structure overlying a substrate having a first conductivity type;
    forming a sidewall spacer adjacent to the gate structure;
    performing an angled implant in a direction of a source side of the semiconductor device to form a region on the source side, in the substrate, and under a portion of the gate structure wherein the angled implant uses dopants that cause a second conductivity type opposite to that of the first conductivity type;
    annealing the semiconductor device;
    forming recesses adjacent opposite ends of the sidewall spacer in the substrate to expose a first type of semiconductor material and to leave a portion of the region of the second conductivity type that is under the gate structure; and
    epitaxially growing a second type of semiconductor material in the recesses, wherein the second type of semiconductor material has a natural lattice constant different from a lattice constant of the first type of semiconductor material to create stress in a channel region of the semiconductor device.

2. The method of claim 1 further comprising performing in-situ doping into the second type of semiconductor material using an in-situ doping material.

3. The method of claim 2, wherein the angled implant is performed at an angle of 5 degrees to 30 degrees relative to a vertical axis.

4. The method of claim 2, wherein the semiconductor device is a P-channel device and wherein the doping material comprises one of a group consisting of Boron, $BF_2$, and Indium, and wherein the second type of semiconductor material is silicon germanium.

5. The method of claim 2, wherein the semiconductor device is an N-channel device and wherein the doping material comprises one of a group consisting of Phosphorous, Arsenic, and Antimony, and wherein the second type of semiconductor material is silicon carbon.

6. The method of claim 2, wherein the semiconductor device is a P-channel device and wherein the in-situ doping material is Boron.

7. The method of claim 2, wherein the semiconductor device is an N-channel device and wherein the in-situ doping material comprises one of a group consisting of Phosphorous and Arsenic.

8. The method of claim 1, wherein the annealing step is performed after epitaxially growing the second type of semiconductor material in the recesses.

9. The method of claim 1, wherein the sidewall spacer has a width in a range of 40 Angstroms to 100 Angstroms.

10. The method of claim 1 further comprising forming source/drain portions corresponding to the semiconductor device and forming silicide layers over the source/drain portions and the gate structure.

11. The method of claim 1, wherein the angled implant is performed into the substrate in a manner that a doping material is implanted into a region underlying at least the sidewall spacer on only the source side of the semiconductor device.

12. A method for forming a semiconductor device, comprising:
    forming a gate structure overlying a substrate;
    forming a sidewall spacer adjacent to the gate structure;
    patterning a photoresist layer such that a drain side of the semiconductor device is covered, but a source side of the semiconductor device is exposed;
    performing an implant into the substrate;
    removing the photoresist layer;
    annealing the semiconductor device;
    forming recesses adjacent opposite ends of the sidewall spacer in the substrate to expose a first type of semiconductor material; and
    epitaxially growing a second type of semiconductor material in the recesses, wherein the second type of semiconductor material has a lattice constant different from a lattice constant of the first type of semiconductor material to create stress in a channel region of the semiconductor device, wherein the second type of semiconductor material is in situ doped into the second type of semiconductor material during the epitaxially growing.

13. The method of claim 12, wherein the semiconductor device is a P-channel device and wherein the doping material comprises one of a group consisting of Boron, $BF_2$, and Indium, and wherein the second type of semiconductor material is silicon germanium.

14. The method of claim 12, wherein the semiconductor device is an N-channel device and wherein the doping material comprises one of a group consisting of Phosphorous, Arsenic, and Antimony, and wherein the second type of semiconductor material is silicon carbon.

15. The method of claim 12, wherein the annealing step is performed after epitaxially growing the second type of semiconductor material in the recesses.

* * * * *